US007751270B2

(12) United States Patent  (10) Patent No.: US 7,751,270 B2
Geens et al.  (45) Date of Patent: Jul. 6, 2010

(54) MEMORY DEVICE WITH REDUCED STANDBY POWER CONSUMPTION AND METHOD FOR OPERATING SAME

(75) Inventors: Peter Geens, Wespelaar (BE); Wim Dehaene, Kessel-lo (BE)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 265 days.

(21) Appl. No.: 12/019,669

(22) Filed: Jan. 25, 2008

(65) Prior Publication Data

US 2008/0219080 A1 Sep. 11, 2008

(30) Foreign Application Priority Data

Jan. 25, 2007 (EP) ................... 07101204

(51) Int. Cl.
*G11C 5/14* (2006.01)
(52) U.S. Cl. ....................... 365/229; 365/227
(58) Field of Classification Search ................. 365/229, 365/227, 206
See application file for complete search history.

(56) References Cited

U.S. PATENT DOCUMENTS

| | | | | |
|---|---|---|---|---|
| 6,507,523 | B2 * | 1/2003 | Pekny | 365/189.09 |
| 6,678,202 | B2 * | 1/2004 | Scott | 365/229 |
| 6,870,790 | B2 * | 3/2005 | Horiguchi et al. | 365/233.15 |
| 6,954,396 | B2 | 10/2005 | Yamaoka et al. | |
| 2004/0090820 | A1 | 5/2004 | Pathak | |
| 2005/0128789 | A1 | 6/2005 | Houston | |
| 2006/0050590 | A1 | 3/2006 | Nautiyal et al. | |
| 2006/0119393 | A1 | 6/2006 | Hua et al. | |

OTHER PUBLICATIONS

European Search Report, European Patent Application No. 07101204.1 dated Jul. 31, 2007.
Lohstroh, Jan et al., "Worst-Case Static Noise Margin Criteria for Logic Circuits and Their Mathematical Equivalence", IEEE Journal of Solid-State Circuits, vol. SC-18, No. 6, Dec. 1983, pp. 803-807.
Wann, Clement et al., "SRAM Cell Design for Stability Methodology", Proceedings of VLSI-TSA Symposium, 2005, pp. 21-22.

(Continued)

*Primary Examiner*—Vu A Le
(74) *Attorney, Agent, or Firm*—McDonnell Boehnen Hulbert & Berghoff LLP (57) ABSTRACT

Disclosed herein are memory devices comprising a plurality of memory cells to which a standby voltage is to be supplied during standby mode to avoid loss of data, and methods of operating said memory devices, the methods comprising: (a) determining an actual value of a bit integrity parameter of the memory cells; (b) comparing said actual value with a predetermined minimal value of the bit integrity parameter which takes into account possible variations in cell properties as a result of process variations; and (c) adjusting the standby voltage towards a more optimal value based on the result of the comparison in such a way that said bit integrity parameter determined for said more optimal value of the standby voltage approaches the predetermined minimal value. The circuitry for measuring the bit integrity parameter preferably comprises a plurality of replica test cells which are added to the memory matrix.

10 Claims, 5 Drawing Sheets

OTHER PUBLICATIONS

Seevinck, Evert et al., "Static-Noise Margin Analysis of MOS SRAM Cells", IEEE Journal of Solid-State Circuits, vol. SC-22, No. 5, Oct. 1987, pp. 748-754.

Pelgrom, Marcel J.M. et al., "Matching Properties of MOS Transistors", IEEE Journal of Solid-State Circuits, vol. 24, No. 5, Oct. 1989, pp. 1433-1440.

Calhoun, Benton H. et al., "Standby Power Reduction Using Dynamic Voltage Scaling and Canary Flip-Flop Structures", IEEE Journal of Solid-State Circuits, vol. 39, No. 9, Sep. 2004, pp. 1504-1511.

* cited by examiner

MEMORY DEVICE WITH REDUCED STANDBY POWER CONSUMPTION AND METHOD FOR OPERATING SAME

TECHNICAL FIELD

The present application discloses a memory device comprising a plurality of memory cells to which a standby voltage is to be supplied during standby mode to avoid loss of data, such as a Static Random Access Memory (SRAM) device. The application further discloses a method for operating such a memory device.

BACKGROUND

In today's integrated circuits, power-consumption is of utmost importance. A main contributor to power-consumption is the standby power due to increasing leakage currents in the deep submicron devices. One way to reduce this leakage and its corresponding power consumption is to reduce the supply voltage of idle parts of the integrated circuit to a minimum voltage level. In Static Random Access Memories, henceforth referred to as SRAMs, standby power consumption becomes more important than dynamic power consumption due to the high density of transistors and their, on the average, low activity. A major issue when reducing the supply voltage of idle parts of the integrated circuit to a minimum voltage level in a SRAM is retaining the data stored in the memory because the supply voltage Vdd cannot be lowered below a minimum voltage level. Lowering the supply voltage Vdd below a certain minimum voltage level reduces the noise margins of the cells, and may cause loss of the data stored in the cell itself, therein negatively affecting the data retention of the memory.

To maximise the standby power reduction, it is crucial to find this minimum voltage. Two known techniques exist for determining a minimum voltage level: the design-time approach and the run-time approach.

Design Time Approach

With the design time approach, a designer can set the minimum voltage level when designing the integrated circuit. In this open-loop approach, first the theoretical minimum voltage level is determined for the given design. The fixed minimum voltage is then calculated by adding a voltage margin to this theoretical minimum. As the minimum voltage level is fixed for a given design, this voltage margin must be chosen sufficiently large to account for: (i) variations in technology over time and from one foundry to another; (ii) variations in the supply voltage and in operating temperature; and (iii) any parameter variation over the area and the lifetime of the chip. The design time approach has the disadvantage that the voltage margin will be chosen in a very conservative way, and a less optimal reduction in standby power consumption can be obtained.

Run Time Approach

In the run time approach, the minimum voltage level is determined directly on-chip, after manufacturing. Calhoun et al discloses in "standby power reduction using dynamic voltage scaling and canary flip-flop structures" IEEE solid-state circuits vol 39, no 9 September 2004, the use of additional flip-flops to monitor the sensitivity of data retention to Vdd. These so-called canary flip-flops are prone to the same process and environmental changes as the real flip-flops. They can be distributed over the chip to account for variations in process, temperature etc. over the chip area which may occur during manufacturing of the chip. Vdd of these canary flip-flops is progressively reduced until they fail; this minimum value of Vdd is used to indicate the minimum voltage level allowed for the real flip-flops in the memory cells.

An alternative to progressively reduce Vdd on the canary flip-flops is to design an array of different flip-flops, each one designed to fail at a progressively lower Vdd. Identifying the boundary between the failing ones and the working ones makes it possible to determine the critical Vdd level.

Although dynamic at first sight, these approaches still use a Vdd value determined only once, when the chip is manufactured and tested. Moreover, this approach only indicates if failure occurs or not, without giving any indication about the cause of failure nor about the achievable noise margin.

Other run-time approaches to reduce Vdd exist, such as raising the grounding voltage or substrate bias of the memory circuit. Changing the substrate bias will affect the threshold voltage. US2004/0090820 discloses a method for reducing the standby power by increasing the ground voltage Vss of the transistors, e.g. by adding a diode in between the SRAM and the ground supply voltage. US2005/0128789 discloses a sleep mode controller to provide a reduced high supply voltage Vdd and an increased low supply voltage Vss during standby mode. None of these applications discloses a criterion to determine or monitor the optimum value of the reduced supply voltages.

PRIORITY CLAIM

This application claims priority under 35 USC § 119 to application EP 07101204.1, which was filed on Jan. 25, 2007.

SUMMARY

It is an aim of the present invention to provide a solution to maximize the power supply voltage reduction of an SRAM during standby mode.

This aim is achieved according to the invention with the method and the memory device of the independent claims.

A method according to a first illustrative embodiment of the present invention comprises the following steps:
  a) determining an actual value of a bit integrity parameter of the memory cells, said actual value taking into account the standby voltage which is actually supplied to the memory cells and environmental changes which are experienced by the memory device in use,
  b) comparing said actual value with a predetermined minimal value of the bit integrity parameter, said predetermined minimal value taking into account possible variations in cell properties as a result of process variations, said comparison yielding a comparison result,
  c) adjusting the standby voltage towards a more optimal value based on said comparison result, such that said bit integrity parameter determined for said more optimal value of the standby voltage approaches the predetermined minimal value.

A memory device according to a second illustrative embodiment of the present invention comprises the following components:
  conductive lines for supplying a standby voltage to the cells,
  first circuitry for determining an actual value of a bit integrity parameter of the memory cells, said actual value taking into account the standby voltage and environmental changes experienced by the memory device in use,
  second circuitry for comparing said actual value with a predetermined minimal value of the bit integrity parameter and yielding a comparison result, said predetermined minimal value taking into account possible variations in cell properties as a result of process variations, a voltage regulator for adjusting the standby voltage towards a more optimal value based on said comparison result, such that said bit integrity parameter determined for said more optimal value approaches the predetermined minimal value.

According to the illustrative embodiments of the invention, use is made of a bit integrity parameter for which a predetermined minimal value is determined after the memory device has been manufactured on the basis of process data, taking into account all possible variations in cell properties as a result of variations during the manufacturing process. These variations are termed static or time-independent variations of the memory device and can for example constitute process variations, random dopant fluctuations, or other. By monitoring the actual value of the bit integrity parameter upon controlling the standby voltage, furthermore all possible dynamic or time-dependent variations can be taken into account, such as for example: temperature, device degradations, changes in power supply, or other. As a result, the control of the standby voltage takes into account the static as well as the dynamic variations upon selecting a more optimal value for the standby voltage, i.e. a value for which the bit integrity parameter approaches the predetermined minimal value. In this way, the standby voltage can be efficiently reduced as far as possible while keeping the risk of loss of data minimal.

The actual value of the bit integrity parameter is preferably determined by run-time measurements on a statistically relevant number of replica test cells of the memory device, which test cells form a representation of all memory cells of the device. These replica test cells are in fact memory cells which are added to the matrix of memory cells, spread out over the whole of the device, so that during manufacture these cells experience the same process conditions and the variations between the test cells represent the variations between the memory cells. The test cells can for example be added as extra rows and/or columns at regular spaces in the memory matrix.

The bit integrity parameter is preferably the Static Noise Margin under Hold conditions (SNMh) or an approximation thereof, such as the minus one gain point, but can also be any other bit integrity parameter of the memory cells known to the person skilled in the art.

The Static Noise Margin is a known bit integrity parameter in the art which is normally measured under read conditions as disclosed in Seevinck et al. in "Static noise margin analysis of MOS SRAM cells", Journal of Solid State Circuits, 1987, which is herein incorporated by reference in its entirety. Here, this known parameter is measured under hold conditions, i.e. in standby mode. It can be measured with the same measurement setup as the traditional SNM with the only difference being the off-state of the pass-transistors. Hence, as used herein, a definition of the Static Noise Margin under hold is the voltage value obtained by measuring the diagonal of the smallest of the maximum squares that can be fitted into the butterfly diagram of an SRAM cell where the access transistors are biased to be in the off-state.

In the case where the SNMh is used as the bit integrity parameter, the actual value of the SNMh is preferably determined indirectly, since the SNMh is difficult to extract directly from measurements. For example, good approximations can be found by obtaining minus one gain points on DC-DC transfer curves of the replica test cells. Alternatively, the voltage difference (Vcrit) between cross-over points of I-V curves of the replica test cells, as disclosed by C. Wann in "SRAM cell design for stability methodology", Proceedings of VLSI-TSA Symposium, 2005, which is herein incorporated by reference in its entirety, or the maximum current (Icrit) of said I-V curve, or a combination of both Icrit and Vcrit values obtained from such a curve can be used as bit integrity parameters. It should be noted that, like with SNM, C. Wann uses the Icrit and Vcrit under read conditions whereas here they are used under hold conditions.

The predetermined minimal value of the SNMh preferably comprises: (i) a first portion determined after manufacture of the device on the basis of process data, measurements, and/or practical experience; and (ii) a second portion which is a correction margin to take into account the spread in SNMh over the memory matrix. As a rule of thumb, this correction margin can, for example, be 100 mV for 90 nm technology, which is also the margin used for the SNM under read conditions, but the correction margin may also have other values, for example, lower values in view of scaling.

DETAILED DESCRIPTION OF THE DRAWINGS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", as used in the specification and claims, should not be interpreted as being restricted to the means listed thereafter; it does not exclude other elements or steps. It should be interpreted as specifying the presence of the stated features, integers, steps or components as referred to, but does not preclude the presence or addition of one or more other features, integers, steps or components, or groups thereof.

For the sake of convenience, the invention will hereafter be described on the basis of an SRAM device. However, the invention is applicable to any memory device in which a standby voltage is to be supplied in standby mode to avoid loss of data.

Figure 6:
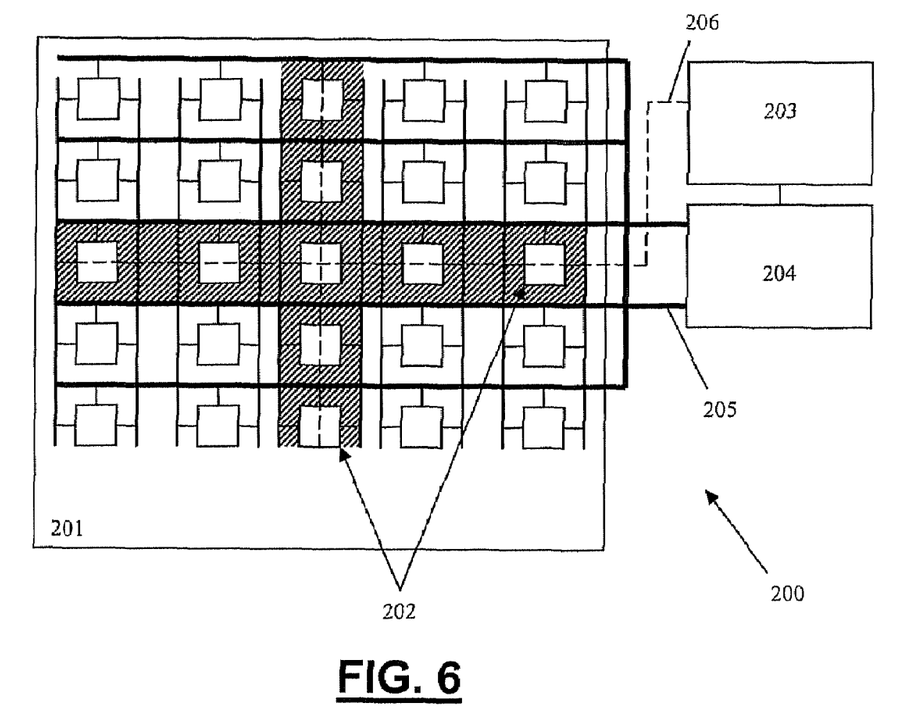
FIG. 6 shows a SRAM device according to one illustrative embodiment of the invention.

FIG. 6 shows a preferred embodiment of an SRAM device 200 according to one illustrative embodiment of the invention. A relevant part of the SRAM cell matrix 201 is replicated to form a set of replica test cells 202, which are substantially identical to the cells in the matrix 201. The number of test cells 202 in the set is chosen to be statistically relevant (screen all possible SNMh curves) for all variations that have occurred during manufacturing of the chip 200. A common node 206 of the test cells 202 is connected to circuitry 203 for measuring and comparing the chosen bit integrity parameter (e.g. SNMh, minus one gain, Icrit/Vcrit, etc.) to the predetermined reference value. An output of this circuitry 203 is fed to a supply regulator 204, which controls the voltage on the supply lines 205.

One preferred implementation is to add separate rows and/or columns of test cells 202, as shown in FIG. 6. A first advantage of such an implementation is that the regularity of the cell matrix 201 is not changed as it would be if only single test cells were inserted in the matrix. A second advantage of such an implementation is that the electrical accessibility of the test cells does not require extra wires other than further bit lines and word lines. If single test cells are inserted in the matrix, separate metal lines would need to be routed in the array to connect the test cells with the circuitry determining the value of the chosen bit integrity parameter. This would be rather difficult to achieve, considering the high wire and cell density of the matrix and the risk of inducing dangerous noise levels in the matrix cells adjacent or crossed by these extra wires. A third advantage of such an implementation is that by having a multiple of test cells in parallel, an average value of the bit integrity parameter, close to the nominal value, can be determined. According to Pelgrom et al. in "Matching properties of MOS transistors" IEEE journal of solid-state circuits vol 24, no 5, October 1989, the variance in a device parameter is inversely proportional to the area of the device. Hence by combining all test cells 202, at least the one in the same row/column, the variance on the bit integrity parameter can be substantially reduced. In fact, deviations on the device dimensions/parameters (if Gaussian distributed) for all the cells in a row or in a column would cancel out each-other. The obtained average estimator of the bit integrity parameter only needs a small correction margin to be added, to take into account the spread in the parameter value over the memory matrix. The spread of the bit integrity parameter value distribution around the nominal value could be determined e.g. by Monte Carlo simulation at design-time. However, this spread will be circuit and technology dependent. Consequently, the determination of the spread, and hence of the margin to be added to reference value of the bit integrity parameter, has to be done for each new SRAM design.

Figure 1:
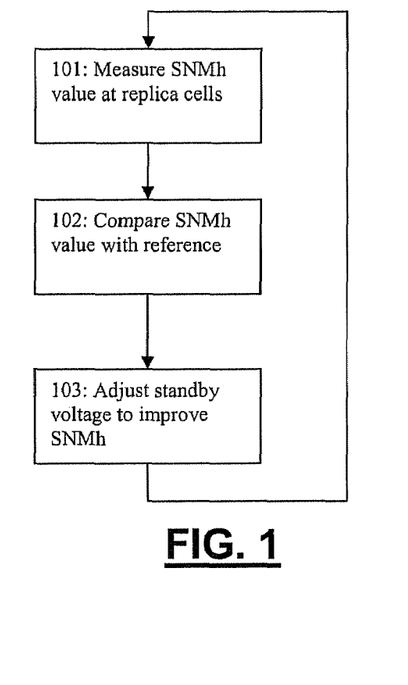
FIG. 1 shows a block diagram of a preferred embodiment of a method according to one illustrative embodiment of the invention.

FIG. 1 shows a an algorithm according to one preferred embodiment, where the SNMh is used as bit integrity parameter. Since SNMh is difficult to measure, it is preferably determined indirectly by using an approximation, see Lostroh et al "Worst-case static noise margin criteria for logic circuits and their mathematical equivalence" in IEEE solid-state circuits vol sc18, no 6 December 1983: minus-1 dB, maximum square, or other. In step 101 of the algorithm, the actual value of the SNMh or the selected SNMh approximation is measured at the replica test cells. Next, in step 102, the obtained value is compared with a predetermined minimal value or "reference value" for the SNMh. This minimum is chosen to take into account all static variations on the properties of the memory cells. The comparison result is used as feedback to adjust the standby voltage to a more optimal value, such that the SNMh will approach the predetermined minimal value. In the embodiment of FIG. 1, this is a continuous process, but this is not essential. The process may also be interrupted and run only on predetermined times to further reduce power consumption.

Figure 2:
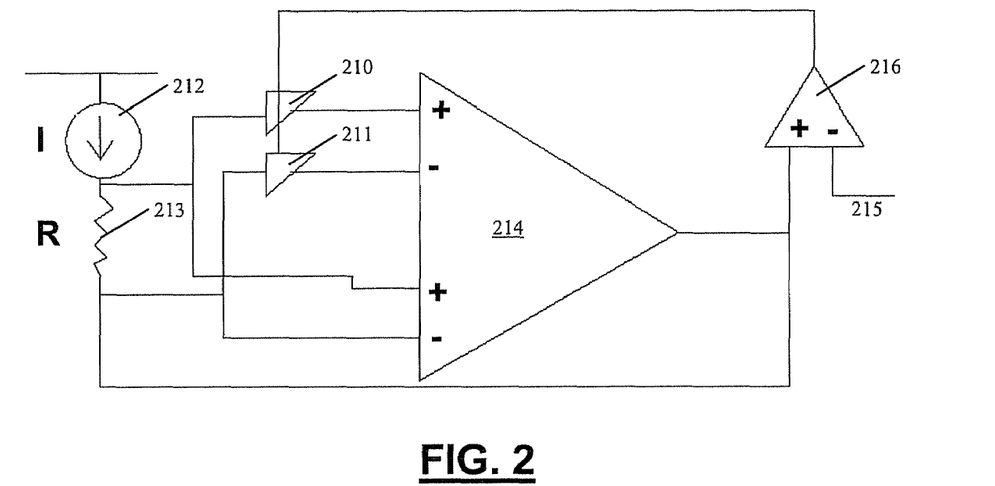
FIG. 2 shows a circuit for controlling the supply voltage on the basis of the minus one gain point as bit integrity parameter, according to another illustrative embodiment of the invention.

FIG. 2 shows one solution to control the standby voltage on the basis of a bit integrity parameter, which is an approximation of the SNMh, by obtaining on the replica test cells 202, the minus one gain points on the DC-DC transfer curves of the invertors composing the SRAM cell as approximation for the SNMh. The obtained minus one gain points are then processed through analog or digital circuits to be compared with a reference value. The error, or the difference between the obtained and reference values of the bit integrity parameter, is then fed back to the biasing circuit. The biasing circuit changes the supply voltage value of both the replicas and main matrix to minimize the SNMh error. In this way, the system will converge to a minimum supply voltage which guarantees the data retention according to the given SNMh reference value.

In the embodiment of FIG. 2, the minus one gain points are obtained as follows. Two identical cell invertors 210, 211 are biased using a current source 212 and a resistive divider 213 to obtain a small difference in input voltages. The minus one gain point is considered to be where the difference in input voltages is equal to the difference in the output voltages of the invertors 210, 211. This comparative functionality is provided by a difference-difference amplifier 214. As the minus one gain point is a good approximation for the SNMh in the cell, this value will be compared with an externally applied reference voltage 215 correspondent to the desired SNMh, by means of comparator 216. This external voltage will provide the set point for the control system. The SNMh difference, or error, is then fed back to the supply voltage regulation circuit 204, thus providing the minimum supply voltage, and consequently the minimum leakage power for the whole system.

Figure 3:
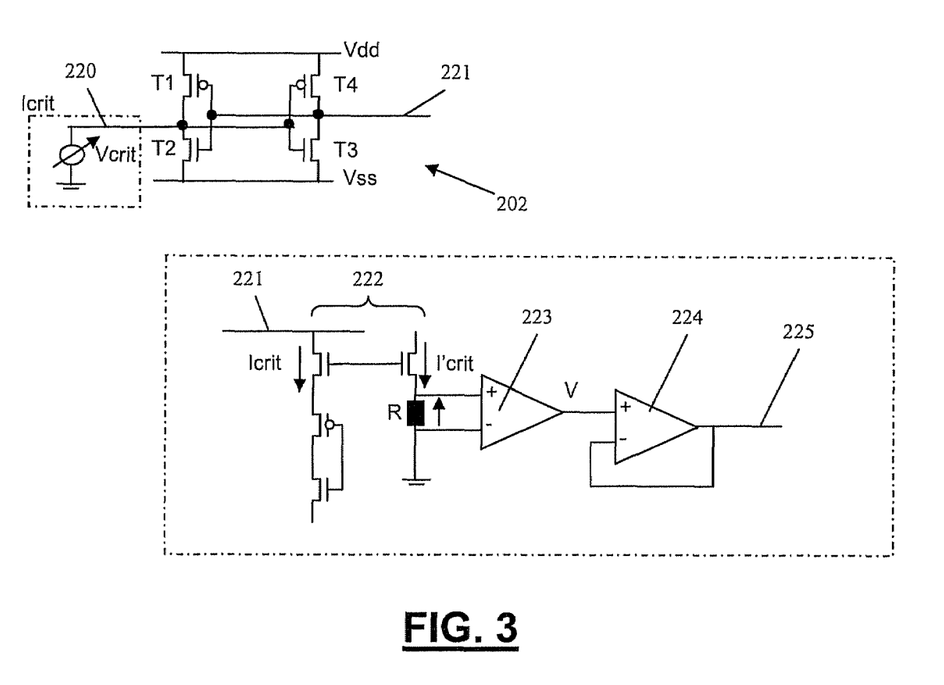
FIG. 3 shows a circuit for controlling the supply voltage on the basis of Icrit or Vcrit as bit integrity parameter, according to another illustrative embodiment of the invention.

FIG. 3 shows a circuit according to another illustrative embodiment of the invention. Here, Icrit and/or Vcrit are used as bit integrity parameters, taken from the so-called "N"-curves known from C. Wann et al., "SRAM cell design for stability methodology", Proceedings of VLSI-TSA Symposium, 2005, which is herein incorporated by reference in its entirety, but here applied under hold conditions instead of under read conditions. The current injected in the SRAM memory cell is monitored by varying the voltage at the bitline 220. The cross-over points in the N-curve, i.e. where I~0 correspond to the cross-over points of the butterfly curve i.e where both S-curves cross. In these points, no current is injected as no switching occurs in the cell. The bit integrity of the circuit can be improved with larger Icrit and/or Vcrit.

The current injected at the bitline 220 is indicative of the amount of charge transported during switching. This charge amount will also depend on the dimensions of the memory cell 200 as the cell area determines the capacitive load. The use of these bit integrity parameters has the advantage that the cell area is taken into account.

The cross-over points in the N-curve are determined as follows. The behavior of the injected current during the cell switching is replicated via a current mirror 222, connected on node 221. The mirrored current Icrit generates a voltage over the resistance R, which is measured by an amplifier 223 and buffered. The buffered voltage V is therefore proportional to the switching current, and can be compared with a voltage reference value of SNMh by means of comparator 224. The obtained result on output 225 is used to regulate the supply voltage Vdd.

Figure 4:
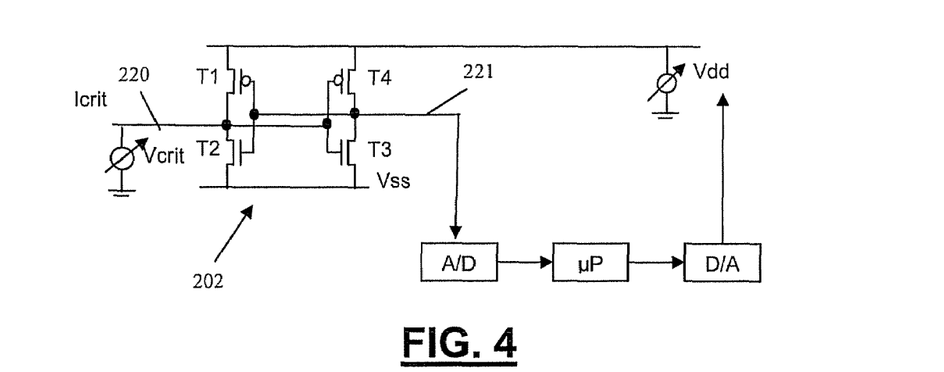
FIG. 4 shows a circuit for controlling the supply voltage on the basis of Icrit or Vcrit as bit integrity parameter, according to another illustrative embodiment of the invention.

FIG. 4 shows an alternative circuit, in which the node 221 is monitored by means of digital circuitry, namely microprocessor μP, connected between A/D and D/A conversion circuitry. The microprocessor constructs the N-curve, determines the parameter Icrit and/or Vcrit from the N-curve, and compares the value to the predetermined reference value, which is stored in associated memory.

In both FIGS. 3 and 4, the feedback loop will decrease or increase Vdd until Icrit meets the reference value. Then the minimal value of Vdd is reached.

Figure 5:
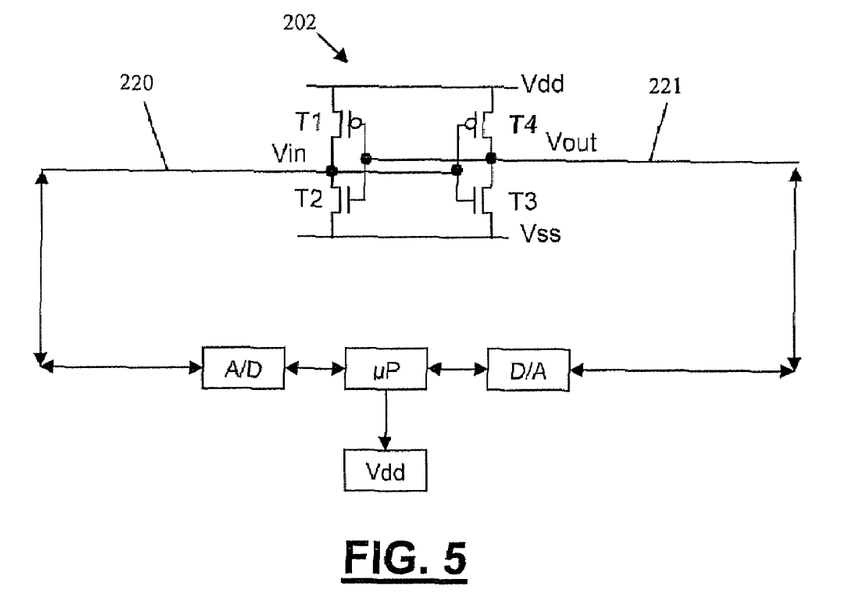
FIG. 5 shows a circuit for controlling the supply voltage on the basis of SNMh, determined from the butterfly curve, as a bit integrity parameter, according to another illustrative embodiment of the invention

FIG. 5 shows circuit according to another illustrative embodiment, in which the SNMh value is determined by measuring and interpreting the butterfly curve by means of a microprocessor. The processor can be dedicated for this task or can be another processor on the chip whose idle time is used advantageously. The SNMh value can, for example, be determined by means of the algorithm of FIG. 7, which comprises the following steps. First, Vin is applied on 220 and Vout (x, y) is measured on 221. Then, the same conditions are applied but reverse, i.e. Vout is applied on 221 and Vin (x', y') is measured on 220. The measurements yield the butterfly curve shown in FIG. 8. The SNMh value is determined from this obtained butterfly curve, as follows.

Figure 8:
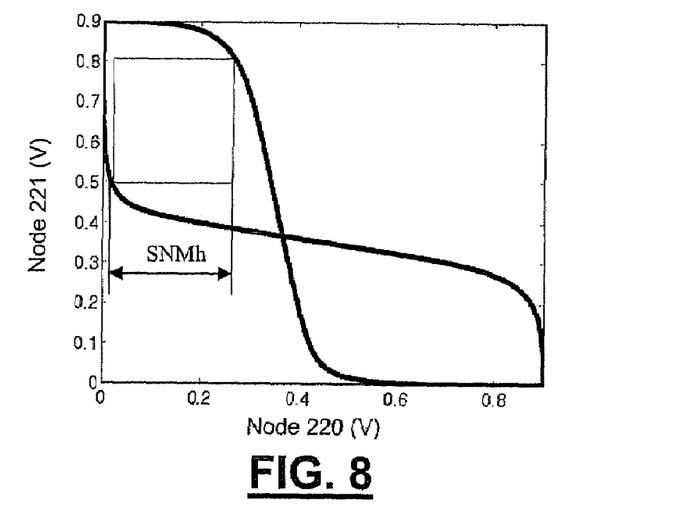
FIG. 8 shows the butterfly curve which is measured by the circuit of FIG. 5.
Figure 9:
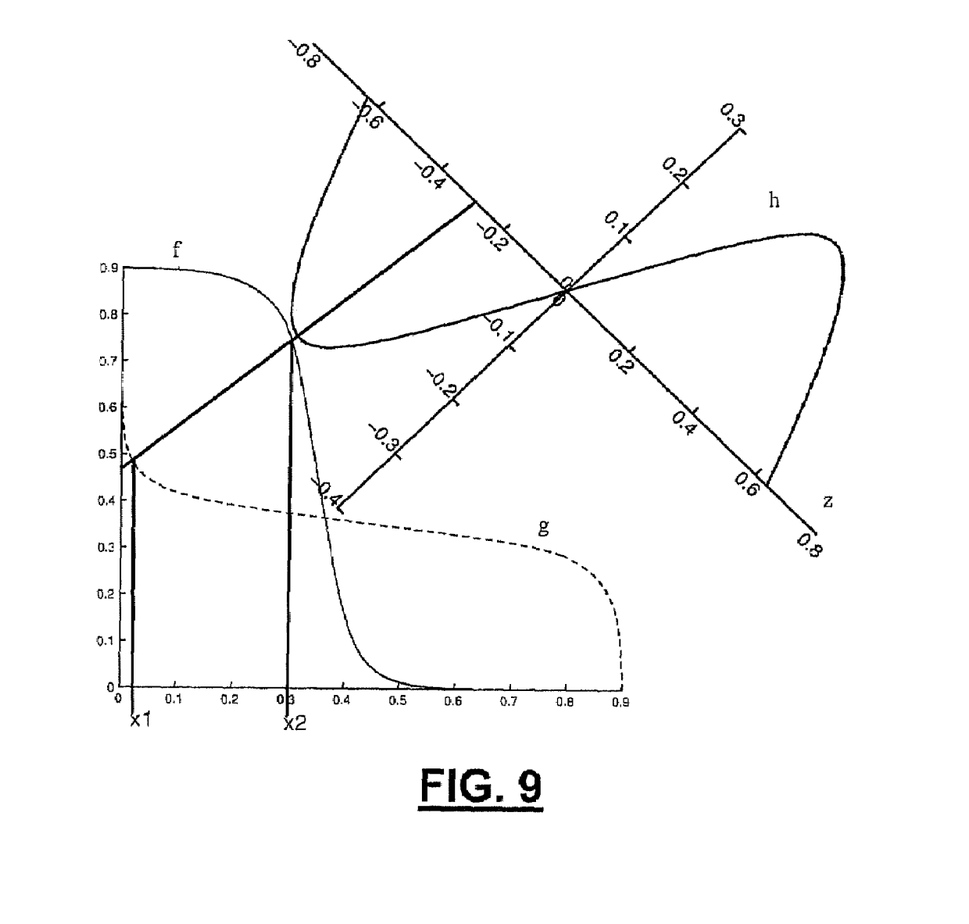
FIG. 9 shows how the butterfly curve is interpreted according to the method of FIG. 7 to determine SNMh.

The SNMh is in fact a mini-max criterion for the eye-opening of the butterfly curve as depicted in FIG. 8. Let $f$ and $g$ be the functions that describe the DC-transfer curves of the cell-invertors, see FIG. 9. In this case $f_{45}$ and $g_{45}$ are f and g rotated over in the coordinate axes rotated over 45 degrees. The eye-opening function, h, would then be equal to formula (1)

$$h = f_{45} - g_{45} \quad (1)$$

SNMh is an extreme of this function, which can be found by deriving the function h to x. This in turn leads to the conclusion that SNMh can be found at the point where the derivatives of $f_{45}$ and $g_{45}$ are equal:

$$\frac{dh}{dz} = \frac{df_{45}}{dz} - \frac{dg_{45}}{dz} = 0 \quad (2)$$
$$\Downarrow$$
$$\frac{df_{45}}{dz} = \frac{dg_{45}}{dz}$$

This requirement is invariant under rotation, so the SNMh can be measured on the butterfly curves in the points where the derivative of both curves is equal: points x1 and x2 on FIG. 9.

Figure 7:
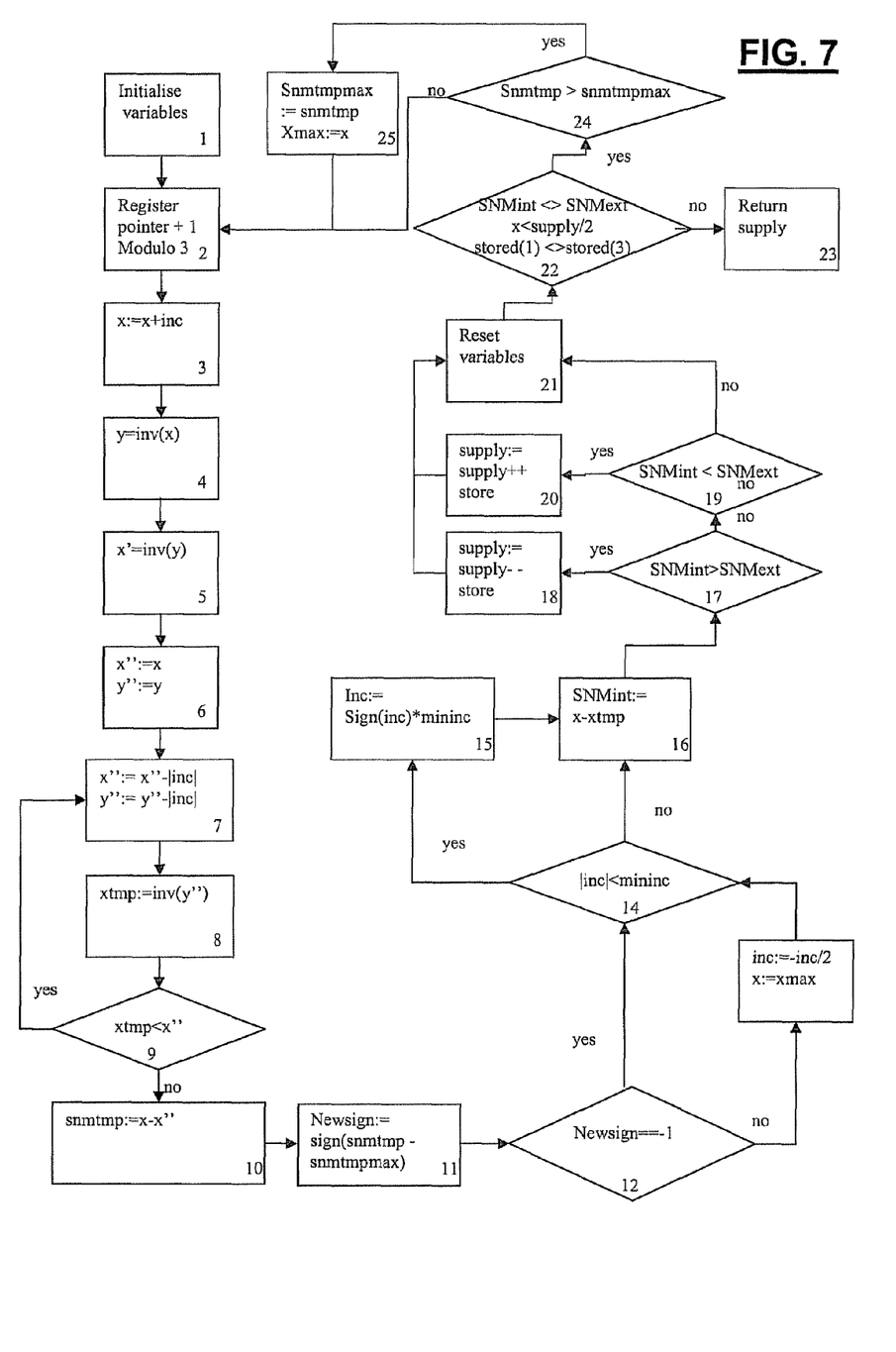
FIG. 7 shows a detailed flow chart according to one preferred embodiment of the invention.

The algorithm shown in the flowchart of FIG. 7 comprises 2 main stages. The first stage will search the point on the second curve over a 45 degree translation corresponding with the current measurement point. The second stage implements a binary search algorithm to find the actual maximum difference. This difference is the SNMh value, which is compared with the predetermined reference, and the results are used to adjust Vdd. The algorithm comprises a further optimization step: when a measured value returns a value that is bigger than the reference value supplied to the system, it is clear the voltage on the cells can be lowered, even if the actual SNMh has not yet been determined.

In more detail, the algorithm of FIG. 7 comprises the following steps:

1. initialise all needed variables to the correct starting value
2. set supply register pointer modulo 3
3. increase x with inc
4. measure y while applying x to the monitor (y:=inv(x))
5. measure x' while applying y to the monitor
6. store x and y as x" and y" respectively
7. reduce x" and y" with decrement
8. measure xtmp while applying y" to the monitor
9. if xtmp < x" then goto 7 else goto 10
10. store snmtmp as the difference between x and x"
11. calculate sign from (snmtmp−snmtmpmax) and store as newsign
12. if newsign is negative goto 14 else goto 13
13. halve inc and change sign; redefine x with stored value xmax
14. if inc in absolute value is smaller than the minimum increment goto 15 else goto 16
15. redefine inc as the minimal increment with the sign of inc
16. define SNMint as x−xtmp
17. if SNMint > SNMext goto 18 else goto 19
18. decrease supply and store the new value
19. if SNMint < SNMext goto 20 else goto 21
20. increase supply and store the new value
21. reset internal loop variales
22. if SNMint is not equal to SNMext and x is smaller than halve the supply and the supply voltage stored at pointer 1 is not equal to the one at pointer 3 goto 24 else goto 23
23. the SNM is reached, return the needed supply value
24. if snmtmp > snmtmpmax goto 25 else goto 2
25. set snmtmpmax to snmtmp and xmax to x

We claim:

1. A method for operating a memory device comprising a plurality of memory cells to which a standby voltage is to be supplied during standby mode to avoid loss of data, comprising the steps of:
   a) determining an actual value of a bit integrity parameter of the memory cells, said actual value taking into account the standby voltage which is actually supplied to the memory cells and environmental changes which are experienced by the memory device in use,
   b) comparing said actual value with a predetermined minimal value of the bit integrity parameter, said predetermined minimal value taking into account possible variations in cell properties as a result of process variations, said comparison yielding a comparison result,
   c) adjusting the standby voltage towards a more optimal value based on said comparison result, such that said bit integrity parameter determined for said more optimal value of the standby voltage approaches the predetermined minimal value.

2. The method of claim 1, wherein the bit integrity parameter is the static noise margin under hold conditions.

3. The method of claim 2, wherein the actual value of the static noise margin under hold conditions is determined by run-time measurements on a statistically relevant number of replica test cells of the memory device, said test cells forming a representation of said memory cells.

4. The method of claim 3, wherein the actual value of the static noise margin under hold conditions is approximately determined by obtaining minus one gain points on DC-DC transfer curves of the replica test cells.

5. The method of claim 3, wherein the actual value of the static noise margin under hold conditions is approximately determined by obtaining cross-over points of N-curves of the replica test cells.

6. The method of claim 3, wherein the actual value of the static noise margin under hold conditions is approximately determined by constructing butterfly curves.

7. The method of claim 2, wherein the predetermined minimal value of the static noise margin under hold conditions is determined on the basis of measurements performed on the device directly after manufacture and/or process data and/or practical experience and includes a correction margin to take into account the spread in the static noise margin under hold conditions over the memory device.

8. A memory device comprising a plurality of memory cells to which a standby voltage is to be supplied during standby mode to avoid loss of data, said memory device comprising:
   a) conductive lines for supplying a standby voltage to the cells;
   b) first circuitry for determining an actual value of a bit integrity parameter of the memory cells, said actual value taking into account the standby voltage and environmental changes experienced by the memory device in use;
   c) second circuitry for comparing said actual value with a predetermined minimal value of the bit integrity parameter and yielding a comparison result, said predetermined minimal value taking into account possible variations in cell properties as a result of process variations;
   d) a voltage regulator for adjusting the standby voltage towards a more optimal value based on said comparison result, such that said bit integrity parameter determined for said more optimal value approaches the predetermined minimal value.

9. The memory device of claim 8, wherein said circuitry for determining said actual value comprises a statistically relevant number of replica test cells forming a representation of the memory cells.

10. The memory device of claim 9, wherein the memory cells are arranged in rows and columns of a memory matrix, the replica test cells being added as additional rows and/or columns of the memory matrix.

\* \* \* \* \*